United States Patent [19]

Noorily

[11] Patent Number: 4,616,102
[45] Date of Patent: Oct. 7, 1986

[54] FLAT CONDUCTOR ELECTRICAL CABLE ASSEMBLY

[75] Inventor: Peter Noorily, Queens, N.Y.

[73] Assignee: Thomas & Betts Corporation, Raritan, N.J.

[21] Appl. No.: 123,489

[22] Filed: Feb. 21, 1980

[51] Int. Cl.$^4$ .......................... H01B 7/08; H01B 7/18
[52] U.S. Cl. ............................... 174/36; 174/117 FF
[58] Field of Search .................... 174/117 FF, 36, 32, 174/106 R; 333/238, 243; 307/91

[56] References Cited

U.S. PATENT DOCUMENTS 3,576,723  4/1971  Angele et al. ............ 174/117 FF X
3,612,744  10/1971  Thomas ......................... 333/243 X
4,219,928  9/1980  Kuo ........................ 174/117 FF X Primary Examiner—Arthur T. Grimley
Assistant Examiner—D. A. Tone
Attorney, Agent, or Firm—Robert M. Rodrick; Salvatore J. Abbruzzese

[57] ABSTRACT

An electrical cable assembly for use in particular with undercarpet wiring systems has a flat multiconductor cable encased in electrical insulation, an insulative film extending lengthwise on the cable and an electrically conductive member overlying the film lengthwise, the conductive member having successive lengthwise extents that are respectively unsecured and secured to the cable. The film is provided with openings therethrough in registry with an exclusive one of the cable conductors through which the conductive member extents are connected to the cable. An electrically conductive shield preferably extends lengthwise with and overlies the conductive member. The shield is selected from material having a hardness greater than that of the conductive member. The material of the conductive member is preferably less cathodic in the electromotive series than the shield material so that in the presence of a corroding medium the shield and not the conductive member will first galvanically corrode.

13 Claims, 4 Drawing Figures

FLAT CONDUCTOR ELECTRICAL CABLE ASSEMBLY

BACKGROUND OF THE INVENTION

1. Field of the Invention

The present invention relates generally to electrical cable systems, and, more particularly, to a flat multiconductor cable assembly which is installed on a floor substrate beneath carpeting.

2. Description of the Prior Art

One type of undercarpet cable system includes a flat multiconductor cable which is assembled between a plastic shield and a metallic shield. The cable assembly, comprising the cable and its two protective shields, is installed between a floor and overlying carpeting. The multiconductor cable includes a plurality of flat electrical conductors which are contained in a casing comprised of a thin sheet of electrical insulation. The plastic shield provides a cushion for the multiconductor cable so as to resist the abrasion and possible piercing of the cable insulation by projections extending upwardly from the floor, such projections being especially prevalent if the floor is made of concrete or a similar coarse building material. The metallic shield is provided to resist piercing of the cable insulation by an object inserted through the carpet. By electrically grounding the metallic shield, any electrically conductive object which may pierce the metallic shield and contact a "hot", i.e., electrically energized, conductor of the multiconductor cable will be grounded so as to protect a person who contacts the object from electrical hazard.

In order to maintain the shield grounded despite possible mechanical discontinuity as occasioned by cutting thereof and to avoid electrical hazards that may be caused by misalignment of the shield and the cable, or relative movement therebetween, the shield has successive extents that are respectively unsecured and secured to the cable as described in U.S. Pat. No. 4,283,593, entitled "Multiconductor Cable", issued on Aug. 11, 1981 and assigned to the same assignee as is the present invention. Thus, electrical connection of the shield to the cable ground conductor is made redundantly at each such secured extent of the shield whereby physical continuity of the shield may be interrupted without interrupting electrical continuity of the remnant shield to ground.

In order to provide cable flexibility and to maintain a thin profile of the cable assembly, as well as to permit ease of splicing and tapping which requires cutting or slicing of the metallic shield, the metallic shield is typically made of ductile material, such as copper, which may be selected to be on the order of several mils thick. Selection of such a thin metallic shield may not only provide minimal resistance to piercing from sharp objects but also minimum heat dissipating and electrical transfer capabilities. Sharp objects that may inadvertently be caused to penetrate the insulative cable casing and contact a "hot" conductor can then cause a localized heating of the shield around the object. Insufficient heat and electrical transfer can result in localized melting of the shield or complete sublimation thereof, leaving the "hot" object exposed and potentially dangerous.

In addition, selecting a thin cable assembly may result in a structure in which the metallic shield is relatively close to the cable conductors producing thereby an undesirably high capacitance and a high leakage current therebetween.

SUMMARY OF THE INVENTION

It is an object of the present invention to provide a cable assembly having a relatively thin profile with effective heat dissipating and electrical transfer capability and enhanced accommodation of piercing by sharp objects.

Another object of the invention is to provide undercarpet cable structure having lessened capacitive leakage current.

In accordance with the present invention, there is provided an electrical cable assembly comprising an electrical cable having a plurality of flat conductors in an electrically insulative casing. An electrically insulative film extends lengthwise on the cable, the film having a portion defining openings through the film in registry with an exclusive one of the conductors for exposing the cable. An electrically conductive member extends lengthwise with the cable, overlying the film, the conductive member having successive extents respectively secured and unsecured to the cable. The secured conductive member extents are electrically connected to the exposed cable through the openings.

The insulative film, preferably being polyvinylchloride on the order of several mils thick, increases the spacing between the conductive member and the cable, reducing thereby the capacitive leakage current therebetween and improving the dielectric strength of the cable assembly.

In a preferred embodiment of the invention, a second electrically conductive member is positioned over the first conductive member. The second conductive member is selected to have a greater hardness than the first conductive member. In addition to increased resistance to penetration by foreign objects, the second conductive member provides an effective heat sink thereby enhancing heat transfer.

In a further preferred embodiment, the material of the first conductive member is selected to be more cathodic in the electromotive series than the second conductive member. While the materials of the first and second members are different, it is desirable that they be selected from groups in the electromotive series that are close so as to minimize galvanic corrosion therebetween. With the second member, i.e., the outer shield of the cable assembly, more anodic, in the presence of a corroding medium or electrolyte, the second member will corrode prior to corrosion of the first member or cable conductors.

DESCRIPTION OF THE PREFERRED EMBODIMENTS

Figure 1:
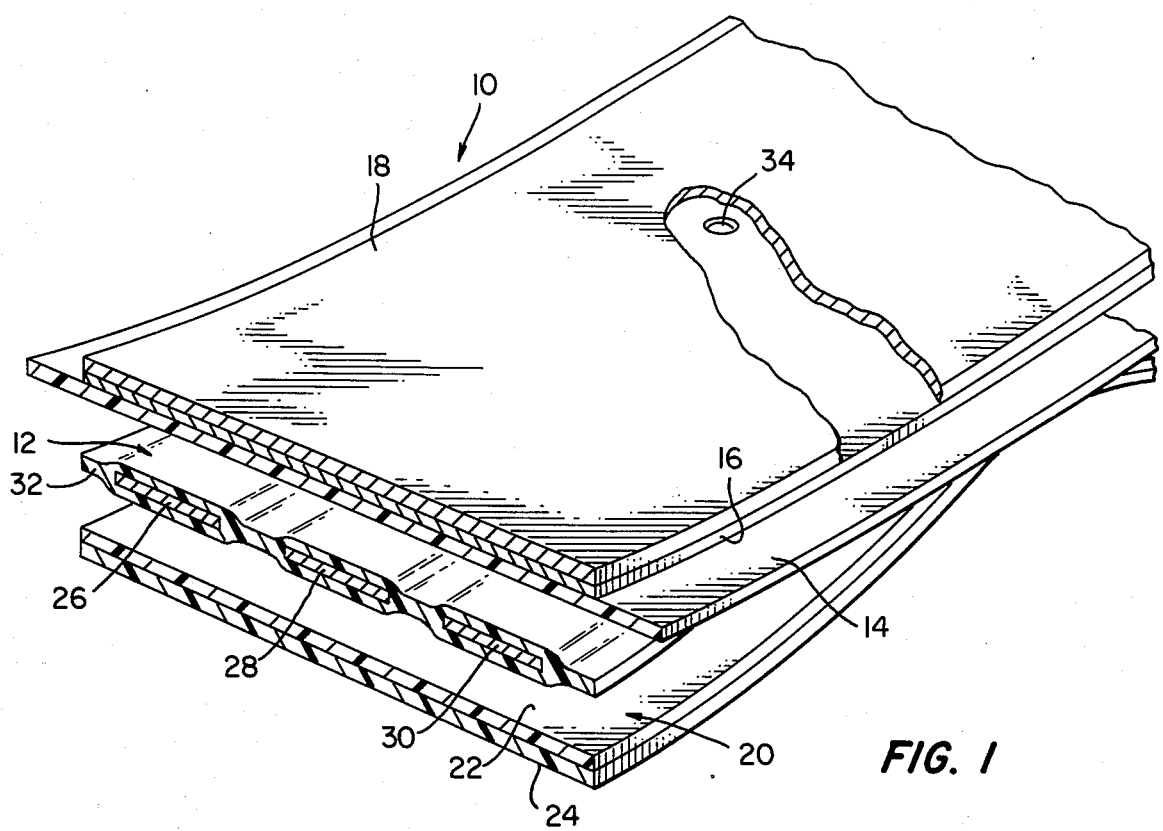
FIG. 1 is a perspective view of a cable assembly constructed in accordance with a preferred embodiment of the present invention.

Referring to the drawing, there is shown in FIG. 1 in accordance with a preferred embodiment of the invention a flexible electrical cable assembly 10. The cable assembly 10 includes a flexible multiconductor cable 12, an electrically insulative film 14 positioned above the cable 12, an electrically conductive, self-sustaining, flexible member 16 positioned over the film 14, an electrically conductive, self-sustaining, flexible shield 18 positioned above the member 16 and a flexible shield 20, preferably comprising two plastic films 22 and 24, positioned below the cable 12. The multiconductor cable 12, the film 14, conductive member 16, conductive shield 18 and the plastic shield 20 are substantially flat such that the cable assembly 10 can be installed underneath a carpet (not shown) or other similar type of floor covering.

The multiconductor cable 12 contains a plurality of flat electrical conductors 26, 28, 30, which are contained within a casing constituted by a thin flat sheet 32 of electrical insulation. The insulation 32 is preferably made from a laminate of polyester and polyvinylchloride. The polyvinylchloride is about four mils thick and is contiguous with the conductors 26, 28, 30, while the polyester is about one and one-half mils thick and forms the outer surface of the cable 12. The conductors 26, 28, 30, which are made from cooper or any other good electrically conductive material, extend side-by-side along the entire length of the multiconductor cable 12.

In the embodiment shown in FIG. 1, the conductors 26 and 30, adjacent to the opposite longitudinally extending edges of the multiconductor cable 12, may be employed as electrically active conductors, the middle conductor 28 serving as a ground conductor. The ground conductor 28 is permanently connected, both mechanically and electrically, through insulative film 14 to the metallic member 16 by a plurality of welds 34 which are arranged at intervals along the length of the cable assembly 10. Alternatively, the ground conductor 28 may be electrically and mechanically connected to the metallic member 16 by a plurality of spaced-apart rivets or any other suitable fasteners. Also, the ground conductor may be a conductor disposed at a side margin of the multiconductor cable 12 and the metallic member 16 could be electrically and mechanically connected to such marginal conductor along the entire length of the cable assembly 10, so that the connection is continuous rather than intermittent.

Figure 2:
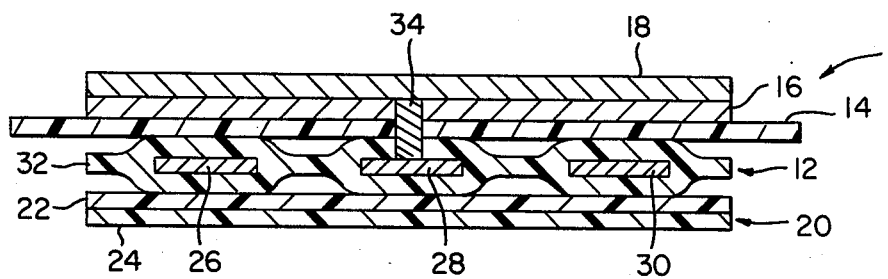
FIG. 2 is a sectional view of the cable assembly of FIG. 1 showing the electrical connection of an overlying metallic member to one of the conductors of the cable.

The selective securement of the conductive member 16 to cable 12 at locations mutually spaced lengthwise of the cable gives rise to successive conductive member extents which are respectively unsecured and secured to the cable 12. Thus, the extent of the member 16 downwardly of the weld 34 in FIG. 1 is not secured to the cable 12 and is thereby displaceable from the cable casing. The successive extent of the member 16, i.e., adjacent the weld 34, is secured to the cable. The next successive shield extent, upwardly of weld 34 in FIG. 1 is again not secured to the cable. This pattern preferably repeats along the cable length, with uniform or nonuniform shield extents giving rise to redundant electrical connection of the member 16 to cable 12. Electrically conductive means are in registry with each secured shield extent. For example, as shown in FIG. 2, the body of material comprising the weldment 34, extends through the member 16, film 14 and through the cable insulative casing 32, the member 16 being in electrical connection with an exclusive one of the cable conductors. The redundant lengthwise connection of the conductive member 16 to the cable 12 is described more fully in U.S. Pat. No. 4,283,593 entitled "Multiconductor Cable" issued Aug. 11, 1981 and assigned to the same assignee as is the present invention, this patent being herein incorporated by reference.

The plastic shield 20 is utilized to provide a cushion for the multiconductor cable 12. As such, the plastic shield 20 preferably includes two films of plastic material constituted by a film of polyester 22 and a film of polyvinylchloride 24. The polyester film 22 may be about two mils thick and the polyvinylchloride may be about four mils thick. Such a composite is believed to be sufficiently strong to protect the multiconductor cable 12 from abrasion and possible piercing as a result of its installation on a floor, especially where the floor is concrete. The plastic shield combination 20, which may be permanently attached to the multiconductor cable 12 in any suitable manner, also provides added protection against penetration by objects extending upwardly from the floor. Preferably, the shield 20 is formed by suitably attaching films 22 and 24 together and then heat-sealing the composite shield 20 to the cable 12 at locations spaced lengthwise of the cable.

The metallic member 16 is made from a thin sheet of good electrically conductive metal, such as copper, having a thickness preferably of about three to five mils. Preferably, the metallic member 16 and the conductors 26, 28 and 30 are made from the same metal to prevent galvanic corrosion between the metallic member 16 and the ground conductor 28 that are interconnected by the weldment 34. In the preferred embodiment, the conductors 26, 28 and 30 and the metallic member 16 comprise a high purity copper, such as, for example, CDA (Copper Development Assoc.)-102, CDA-110 and CDA-122, commercially available from various sources.

In accordance with the invention, the insulative film 14 is disposed lengthwise of the cable 12 between the conductive member 16 and the insulative casing 32 of the cable 12, the film having an opening in registry with an exclusive one of the conductors for exposing the cable 12 for electrical connection to the metallic member 16. In the preferred embodiment as shown in FIG. 2, the longitudinal edges of the film 14 extend laterally beyond the edges of the conductive member 16 to provide a safety means for diminishing the cutting ability of the metallic edges thereof. Other safety measures for reducing cutting ability, such as folding the longitudinal edges of the metallic member 16 may also be utilized. The insulative film 14 is provided to extend substantially across the width of the cable 12 to increase the spacing between the metallic member 16 and the cable 12 to reduce the capacitance and thereby the leakage current therebetween. Such a structure desirably increases the overall dielectric strength of the cable assembly and tends to reduce the amount of sparking and noise that could result from a foreign object penetrating the cable assembly. In the preferred embodiment, the insulative film 14 is made of polyvinylchloride having a thickness of about four mils although other suitable electrically insulative materials having other various suitable thicknesses may also be used.

Figure 3:
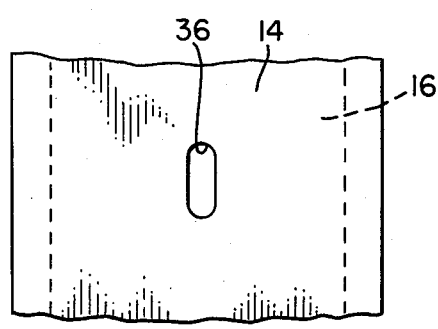
FIGS. 3 and 4 are fragmentary bottom elevation views of two arrangements of insulative film on the undersurface of a conductive metallic member prior to positioning on the cable.
Figure 4:
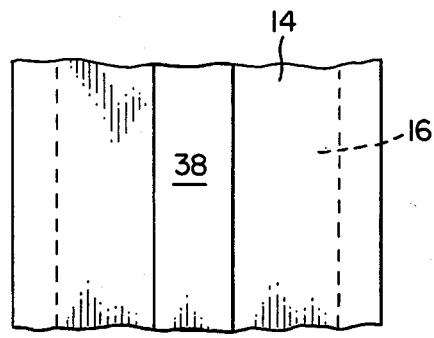

For ease of assembly, the insulating film 14 may be attached as by suitable means to the metallic member 16 before the member 16 is positioned on the cable 12. As shown in FIG. 3, the film is preferably formed to extend laterally across the width of the member 16 and to have openings, such as an aperture 36 formed therethrough at lengthwise intervals in registry with each of the weldments 34 when the member 16 is secured to the cable 12. Also, as shown in FIG. 4, the film 14 extending laterally across the member 16 may have a slot 38 formed lengthwise through said film in substantial registry with an exclusive one of the conductors, such as, for example, conductor 28 (not shown).

In accordance with another aspect of the present invention, the conductive shield 18 is positioned over separably the metallic member 16. In the cable assembly wherein the metallic member 16 is made of relatively soft, ductile material, such as copper, the material of shield 18 is selected to have a hardness oreater than that of the member 16 so as to provide added protection to resist piercing of the cable 12 by an object through an overlying carpet. For example, where the member 16 is copper, the shield 18 may be made of stainless steel having a thickness from three to five mils.

In addition, the shield 18 is provided to improve the heat dissipating and electrical transfer capability of the cable assembly. Should a metallic foreign object pierce the cable 12 and strike an electrically "hot" conductor with the foreign object contacting the member 16, the member 16 would become thermally hot due to the high heat flux and electrical current through the object. The conductive shield 18 serves as a heat sink tending to reduce the temperature of the member 16 thereby reducing the chances of the member 16 melting or sublimating around the foreign object. The conductive shield 18 provides further electrical advantage. If the member 16 sublimates due to excessive heat around a foreign object, such as a nail, the nail, no longer being in contact with the member 16, would be electrically "hot" and potentially dangerous without the shield 18. With the conductive shield 18, the "hot" nail touching the shield 18 would be grounded since the shield is in contact with the grounded metallic member 16.

While the material of the conductive shield 18 is selected for its hardness and heat dissipating capabilities, the effects of galvanic corrosion are to be considered, in particular, where the shield 18 serves as a ground as herein described. Whereas it is ideal that for galvanic corrosion purposes, the shield 18 and the metallic member 16 be made of the same materials, for other purposes such as increased hardness, such material selection may not be practical. It is well known that in galvanic corrosion, caused as a result of two metals in contact in a corroding medium or electrolyte, the one metal that is higher in the electromotive series, i.e., is more anodic than the other metal, will be corroded. While it is desirable to select two metals in the electromotive series that are either the same or electrically relatively close to minimize galvanic corrosion, it is preferable in accordance with the present invention that the conductive member 16 be not more anodic in the electromotive series than the shield 18. Thus, if the shield 18 is more anodic and a corrosive medium is present, the shield 18 will corrode prior to the conductive member 16 or the conductor 28 to which member 16 is electrically connected. For example, where stainless steel is used for its hardness properties, it is preferable that such steel be of the active 300 series type, such materials being relatively close to copper in the electromotive series but more anodic.

Although the cable assembly has been described herein in the embodiment of a single substantially flat conductor cable assembly, it should be appreciated that the invention is also useful with a plurality of such cables that are interconnected to form various power systems. Furthermore, the cable assembly as described herein may also be folded and overlapped to change the course of direction of the cable assembly so that the cable assembly extends in different directions in accordance with the requirements of the system.

Although the width of the shield 18 is preferably about the same width as that of the metallic member 16, the shield 18 may be formed to have its longitudinal edges extend laterally beyond the edges of the entire cable assembly so as to drape over and taper the cable assembly edges for diminished height appearance beneath a carpet.

Various changes to the foregoing, specifically disclosed embodiments and practices will be evident to those skilled in the art. Accordingly, the foregoing preferred embodiments are intended in an illustrative and not in a limiting sense. The true spirit and scope of the invention is set forth in the following claims.

What is claimed is:

1. An electrical cable assembly, comprising:
    an elongate electrical cable having a plurality of flat conductors in an electrically insulative casing;
    an electrically insulative member extending lengthwise on said cable and having a portion defining an opening therethrough in registry with an exclusive one of said conductors;
    a first electrically conductive member extending lengthwise with said cable, overlying said insulative member, and having successive lengthwise extents respectively secured and unsecured to said cable, a secured conductive member extent being electrically connected to said exclusive conductor through said opening; and
    a second electrically conductive member extending lengthwise on and separably overlying said first electrically conductive member, said first conductive member being not more anodic in the electromotive series than said second conductive member.

2. An electrical cable assembly according to claim 1, wherein said insulative member extends substantially across the width of said cable.

3. An electrical cable assembly according to claim 1, wherein the materials of said first and second conductive members are different.

4. An electrical cable assembly according to claim 3, wherein said second conductive member is stainless steel.

5. An electrical cable assembly according to claim 4, wherein said first conductive member is copper.

6. An electrical cable assembly according to claim 3, wherein the hardness of said second conductive member is greater than the hardness of said first conductive member.

7. An electrical cable assembly, comprising:
    an elongate electrical cable having a plurality of flat conductors in an electrically insulative casing;
    an electrically insulative member extending lengthwise on and laterally across said cable;
    a first electrically conductive member extending lengthwise with said cable and overlying said insulative member;
    a plurality of electrical connector means disposed in mutually spaced relation lengthwise of said first conductive member for redundant electrical connection of said first conductive member to an exclusive one of said flat conductors; and a second self-sustaining electrically conductive member extending lengthwise on and separably overlying said first electrically conductive member.

8. An electrical cable assembly according to claim 7, said insulative member having a portion defining an opening therethrough in registry with an exclusive one of said conductors, said first conductive member being electrically connected to such exclusive one of said conductors by said electrical connector means through said opening.

9. An electrical cable assembly according to claim 8, wherein said first conductive member is copper.

10. An electrical cable assembly according to claim 9, wherein said second conductive member is stainless steel.

11. An electrical cable assembly according to claim 7, wherein said second conductive member is more anodic in the electromotive series than said first conductive member.

12. An electrical cable assembly according to claim 7, wherein said second conductive member has a greater hardness than said first conductive member.

13. An electrical cable assembly, comprising:

an elongate electrical cable having a plurality of flat conductors in an electrically insulative casing;

an electrically insulative member extending lengthwise on said cable, said insulative member extending substantially across the width of said cable and having a portion defining a slot extending lengthwise through said insulative member, said slot extending in registry with the length of an exclusive one of said conductors for exposing said cable;

an electrically conductive member extending lengthwise with said cable, overlying said insulative member, and having successive extents respectively secured and unsecured to said cable, such secured conductive member extent being electrically connected to said exposed cable through said slot; and a separable electrically conductive shield extending lengthwise on said electrically conductive member.

* * * * *